United States Patent [19]

Breitling et al.

[11] Patent Number: 4,675,788

[45] Date of Patent: Jun. 23, 1987

[54] MULTI-LAYER CIRCUIT BOARD

[75] Inventors: Wolfram Breitling, Sachsenheim; Werner Sonnabend, Straubenhardt, both of Fed. Rep. of Germany

[73] Assignee: Schroff Gesellschaft Mit Beschrankter Haftung, Straubenhardt, Fed. Rep. of Germany

[21] Appl. No.: 755,728

[22] Filed: Jul. 17, 1985

[30] Foreign Application Priority Data

Jul. 17, 1984 [DE] Fed. Rep. of Germany ....... 3426278

[51] Int. Cl.$^4$ .............................................. H05K 1/14
[52] U.S. Cl. .................................... 361/414; 174/36; 174/68.5
[58] Field of Search .................. 361/414; 174/68.5, 36

[56] References Cited

U.S. PATENT DOCUMENTS 3,351,816 11/1967 Sear et al. ......................... 174/36 X
3,499,219 3/1970 Griff et al. .............................. 174/36
3,875,478 4/1975 Capstick ......................... 361/414 X
4,170,819 10/1979 Peter et al. ...................... 174/68.5 X
4,173,745 11/1979 Saunders ......................... 174/68.5 X
4,362,899 12/1982 Borrill ................................... 174/36

OTHER PUBLICATIONS

Daughton et al., Feed-Through Connectors to Striplines Evaporated on Insulated Ground Planes, IBM Tech. Disc. Bull., vol. 7#2, Jul. 1964, p. 153.

Primary Examiner—R. R. Kucia
Attorney, Agent, or Firm—Antonelli, Terry & Wands

[57] ABSTRACT

A multi-layer circuit board which includes at least two boards carrying conductors and a shielding foil interposed between the two boards. The circuit board is provided with a through hole including a metallic lining in electrical connection with the shielding foil. The lining includes an insulating layer on which a conductive metal layer is disposed. The metal layer, electrically separated from the lining by the insulating layer, is in electrical connection at respective ends thereof with the conductors. By virtue of this arrangement a coaxial design of a through hole results thereby permitting a total decoupling with respect to adjacent or neighboring through hole connections.

12 Claims, 1 Drawing Figure

U.S. Patent   Jun. 23, 1987   4,675,788
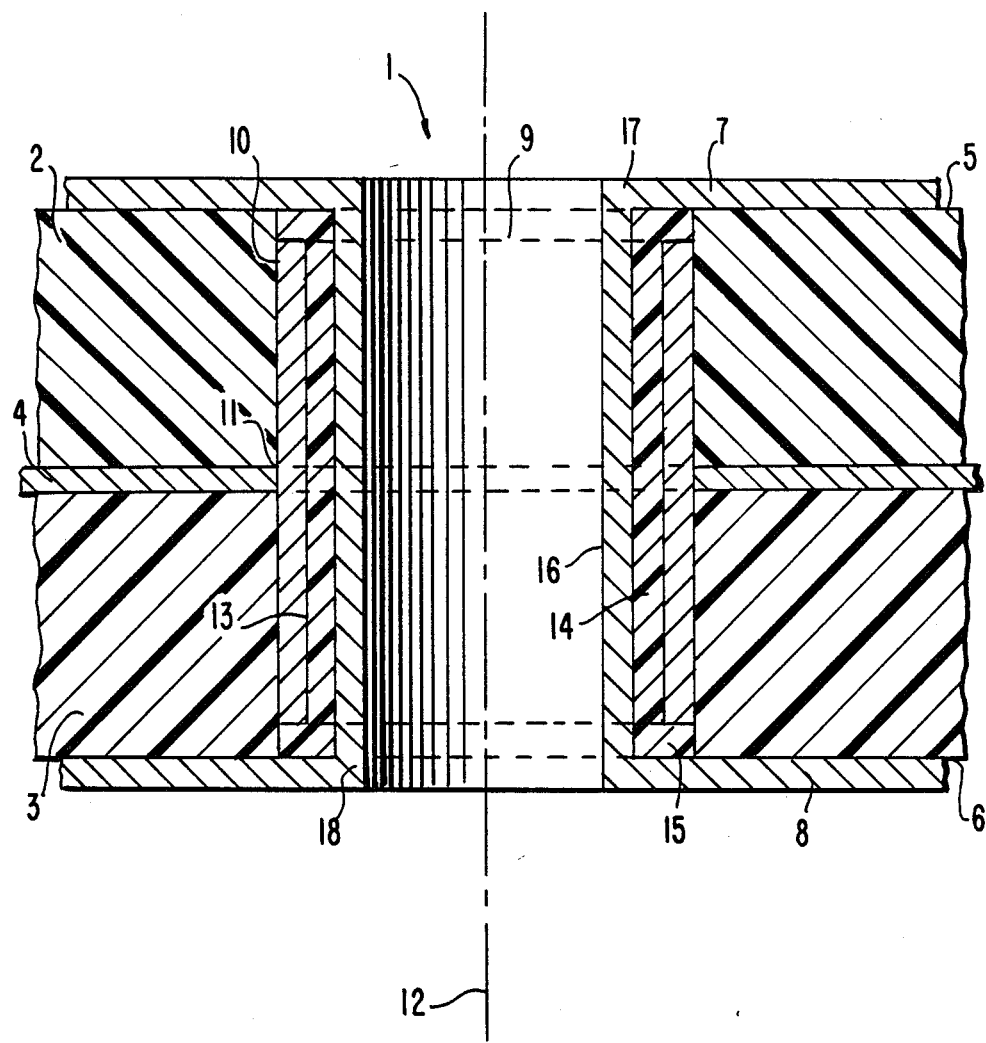

MULTI-LAYER CIRCUIT BOARD

The present invention relates to a printed circuit construction and, more particularly, to a multi-layer printed circuit board for enabling a manufacturing of printed circuits, with the circuit board including, for example, two boards made of, for example, a synthetic resin, and provided with metallic conductors, with a shielding member such as, for example, a foil, being arranged between the two boards, and with a plurality of through holes each of which are provided with a lining of an electrically conductive material and being in connection with the shielding foil, with the lining carrying an insulating layer on which an electrically conductive metal layer is disposed.

Circuit boards for enabling the manufacturing of printed circuits have been known for years, with the active and passive components of the printed circuits being soldered in through holes and connected together by conductors applied by electrodeposition. In order to establish a conductive connection between the conductors on a top or mounting side with those on the under or soldering side, through holes are utilized which include a lining of an electrically conductive material, with the lining being applied together with the conductors. Such connections between conductors on the upper and lower side of the circuit boards are frequently called "through connections".

In order to enable the construction of complex circuits with the aid of printed-circuit board technique, multi-layer circuit boards have been employed, with the connection being effected between conductors of different planes by conductive linings for specific through holes or through connections.

In order to provide for an interference decoupling of neighboring or adjacent conductors of different planes, metallic shielding foils are generally utilized between the individual boards of multi-layer circuit boards, lying at a specific, fixed electrical potential whereby effective shielding can be achieved and cross talk from one plane to the other is prevented.

In order to electrically decouple, as far as possible, also conductors which lie side-by-side in parallel on the same plane, conductors lying at a fixed potential are arranged between current-conducting conductors.

With the demand for increasing circuit density and the rising number of juxtaposed and superimposed conductors, mutual shielding becomes increasingly difficult in view of the use of ever higher operating frequencies of currents to be conducted. Moreover, the buslines, used for connecting the components of the computer systems with one another, pose particularly high requirements and, in this instance, for reasons of operating safety, a mutual electrical influencing of neighboring or adjacent conductors must be avoided under all circumstances.

It has been determined that the conductive connections of conductors on the upper and lower sides of the circuit boards, established through the linings of through holes or through connections, represent a source of cross-talk interferences of neighboring conductors. Linings arranged side-by-side exhibit, with respect to one another, a certain, although small, capacitance which is the cause for a cross-talk. If neighboring through connections can be successfully decoupled, then the operating safety of the systems can be increased and/or the packaging density of the printed circuit boards can be considerably increased.

The aim underlying the present invention essentially resides in electrically decoupling through-hole connections of printed circuit boards for the purpose of avoiding cross-talk interferences.

In accordance with advantageous features of the present invention, a multilayer circuit board which includes, for example, first and second circuit boards or plates is provided with the respective plates being equipped with conductors. A shielding member in the form of a shielding foil is interposed between the two plates or boards and a plurality of through holes, each of which are provided with a lining that is connected to the shielding foil, are provided in the respective boards, with the lining carrying an insulating layer on which a conductive metallic layer is disposed.

In accordance with the present invention, the metallic layer, electrically separated from the lining by the insulating layer, is in electrical connection at respective ends thereof with the conductors. By virtue of a construction of a through hole in accordance with the present invention it is possible to, for example, electrically set the lining to a fixed potential and utilize the same as a shield, with the metallic layer serving, in place of the lining, as a conductive connection between the conductors of the upper and lower side of the respective circuit boards or plates.

Advantageously, in accordance with further features of the present invention, an interior of a through hole is fashioned as a coaxial conductor with the lining being the external conductor and the metal layer being the internal conductor. The thereby attained shielding of the through hole connection is thus total over the entire thickness of the respective circuit boards and a decoupling with respect to the neighboring through connections, especially in thick multi-layer circuit boards, is excellent.

Moreover, by virtue of the coaxial conductor arrangement achievable by the present invention, it is possible to establish in a single through hole two electrically separate connections between conductors on the upper side and lower side of a circuit board.

The metal layer disposed on the insulating layer can, in accordance with further features of the present invention, be constructed as a plug-in sleeve in the form of, for example, a very thin copper tube thereby providing a further expedient.

Advantageously, the insulating layer may be in the form of a layer of insulating varnish thereby considerably facilitating the manufacture of the proposed through connection.

Accordingly, it is an object of the present invention to provide a multi-layer printed circuit board which avoids, by simple means, shortcomings and disadvantages encountered in the prior art.

Another object of the present invention resides in providing a multi-layer printed circuit board which is simple in construction and therefore relatively inexpensive to manufacture.

A still further object of the present invention resides in providing a multi-layer printed circuit board which ensures a mutual shielding between juxtaposed and superimposed conductors.

A still further object of the present invention resides in providing a multi-layer printed circuit board which avoids cross-talk interferences.

These and other objects, features, and advantages of the present invention will become more apparent from the following description when taken in connection with the accompanying drawing which shows, for the purposes of illustration only, one embodiment in accordance with the present invention, and wherein:

The single figure is a partial longitudinal cross-sectional view, taken through a through hole, of a double-layer printed circuit board constructed in accordance with the present invention in an approximately thirty fold enlargement.

Referring now to the single figure of the drawing, according to this figure, a double-layer circuit board or slice generally designated by the reference numeral 1, formed of a synthetic resin, includes two plates or boards 2, 3, of the same thickness, with a shielding means such as, for example, a copper foil 4, being arranged between the plates 2, 3. The shielding foil 4 provides an electrostatic shielding or decoupling of the metallic conductor 7, 8 applied on the upper and lower surfaces 5, 6 of the double-layer circuit board 1, thus displaying a bilateral conductor pattern.

The double-layer circuit board 1 is provided with a large number of through holes 9 located side-by-side and one behind the other, with the through hole 9 serving primarily for enabling an attachement of electrical circuit elements (not shown) such as, for example, resistors, capacitors, transistors, integrated circuits, arranged on the double-layer circuit board 1, with the connecting wires or leads of the electrical circuit elements being passed through the through holes 9 and secured to the conductors 7, 8 by, for example, soldering.

The through hole 9 is provided with a lining 10 applied by an electrode deposition, with the lining 10 consisting essentially of an electrically conductive material such as, for example, copper. The lining 10 is fashioned as a thin, cylindrical tube and is electrically conductively connected in a center area 11 thereof to the shielding foil 4. The lining 10 has an axial length less than an axial length of the respective throughholes 9.

An insulating layer in the form of, for example, a layer of insulating varnish, is provided on an inner surface 13 which faces a longitudinal center axis 12 of the through hole 9. The insulating layer 14 is fashioned or formed as a thin cylindrical tube provided at respective outer ends thereof with an outwardly oriented longitudinally extending small flange 15 which encompasses, in an insulating fashion, respective outer end surfaces of the lining 10. A metallic layer 16 of an electrically conductive material of, for example, electrode deposited copper, is arranged on the insulating layer 14, with the metallic layer 16 being fashioned as a tubular cylindrical member as with the lining 10, and the insulating layer 14. The metallic layer 16 is in an electrical connection at respective ends 17, 18 thereof with the conductors 7, 8. As can readily be appreciated, the metallic layer 16 may also take the form of a small tubular cylindrical plug-in sleeve.

The metallic layer 16 and the insulating layer 14, together with the lining 10, form a section of a hollow coaxial conductor, with the lining 10 being the external conductor and the metal layer 16 being the internal conductor.

While We have shown only one embodiment in accordance with the present invention, it is understood that the same is not limited thereto but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A multi-layer printed circuit board for enabling a manufacture of printed circuits, the multi-layer print circuit including a first and second circuit board, each of said first and second circuit boards including an outer surface and an inner surface, the inner surfaces of said first and second circuit boards being disposed in composition to each other, metallic conductor means provided on each of said first and second circuit boards, a shielding means interposed between said inner surfaces of said first and second circuit boards for enabling an electrostatic decoupling of said metallic conductor means, a plurality of throughholes provided in said first and second circuit boards for accomodating portions of electrical circuit elements of the printed circuits, an electrically conductive lining means provided in each of said throughholes and connected to said shielding means, said electrically conductive lining means having an axial length less than an axial length of said throughholes, an electrically conductive metallic layer disposed in each of said throughholes connected to said metallic conductor means, an insulating means disposed on said electrically conductive lining means for electrically separating the electrically conductive metallic layer from said electrically conductive lining means, said insulated lining means including a pair of flange means interposed between respective ends of said electrically conductive lining means and said electrically conductive metallic conductor means so as to insulate the respective ends of the electrically conductive lining means from the electrically conductive metallic layer means, said flange means being disposed between the respective ends of the electrically conductive layer means and the respective outer surfaces of said circuit boards, and wherein respective ends of said electrically conductive metallic layer are electrically connected to said electrically conductive metallic conductor means.

2. A multi-layer printed circuit board according to claim 1, wherein the metallic layer is a plug-in sleeve means adapted to be respectively accomodated in the through holes.

3. A multi-layer printed circuit board according to claim 2, wherein said insulating means is a layer of an insulating varnish.

4. A multi-layer printed circuit board according to claim 1, wherein said shielding means includes a copper foil.

5. A multi-layer printed circuit board according to claim 4, wherein said first and second boards are made of a synthetic resin.

6. A multi-layer printed circuit board according to claim 5, wherein said insulating means is disposed on an inner peripheral surface of said eletrically conductive lining means and is interposed between said electrically conductive lining means and said electrically conductive metal metallic layer.

7. A multi-layer printed circuit board according to claim 6, wherein said electrically conductive lining means is electrodeposited in the respective through holes.

8. A multi-layer printed circuit board according to claim 7, wherein the electrically conductive metallic layer is electrodeposited on the insulating means.

9. A multi-layer printed circuit board according to claim 1, wherein said insulating means is a layer of an insulating varnish.

10. A multi-layer printed circuit board according to claim 1, wherein said electrically conductive insulating means is disposed on an inner peripheral surface of said lining means and is interposed between said electrically conductive lining means and said electrically conductive metallic layer.

11. A multi-layer printed circuit board according to claim 1, wherein said electrically conductive lining means is electrodeposited in the respective through holes.

12. A multi-layer printed circuit board according to claim 1, wherein the electrically conductive metallic layer is electrodeposited on the insulating means.

* * * * *